United States Patent [19]
How et al.

[11] Patent Number: 5,847,573
[45] Date of Patent: Dec. 8, 1998

[54] METHOD AND APPARATUS FOR STRUCTURE CHARACTERIZATION OF LAYERED SEMICONDUCTORS

[75] Inventors: Hoton How, Belmont; Ta-Ming Fang, West Newton, both of Mass.

[73] Assignee: Massachusetts Technological Laboratory, Inc., Belmont, Mass.

[21] Appl. No.: 543,250

[22] Filed: Oct. 13, 1995

[51] Int. Cl.$^6$ .................................................. G01R 31/00
[52] U.S. Cl. ........................................... 324/765; 324/752
[58] Field of Search ................................... 324/750, 751, 324/752, 765, 760, 767, 501; 250/492.2

[56] References Cited

U.S. PATENT DOCUMENTS

| | | | |
|---|---|---|---|
| 4,370,612 | 1/1983 | Puech et al. ............................. | 324/96 |
| 4,371,838 | 2/1983 | Griscom ................................... | 324/244 |
| 4,816,755 | 3/1989 | Look et al. .............................. | 324/765 |
| 4,949,034 | 8/1990 | Imura et al. ............................. | 324/765 |
| 5,047,713 | 9/1991 | Kirino et al. ............................ | 324/767 |
| 5,150,042 | 9/1992 | Look et al. .............................. | 324/765 |
| 5,430,386 | 7/1995 | Morin et al. ............................. | 324/765 |

OTHER PUBLICATIONS

H. How, et al., Model for the AC Hall Effect of High–Tc Superconductors, Journal of Superconductivity, vol. 2, no. 4, 1989, pp. 479–484. (Unavalible Month).

H. How, et al., AC Hall Measurements on High–Tc Superconductors, Journal of Applied Pysics 67(9), May 1, 1990, pp. 4545–4546.

*Primary Examiner*—Vinh P. Nguyen
*Attorney, Agent, or Firm*—Devine, Milliment & Branch, P.A.; Paul C. Remus, Esq.; Kristin Kohler, Esq.

[57] ABSTRACT

A new technique is presented which exploits AC Hall effect in the characterization of layered semiconductor structures. The method involves the use of laser signals by means of optical fibers in the presence of a DC magnetic bias field. Upon incidence the polarization of the optical signal is rotated via a Lorentz force due to the AC Hall effect. As such, the reflected waves carry informations on the Hall mobility of the charge carriers. The calculations show that AC Hall reflection coefficient warrants sufficient intensity to be measured. Our theory is complete in the sense that depth profiling has been explicitly incorporated in the formulation.

10 Claims, 3 Drawing Sheets

METHOD AND APPARATUS FOR STRUCTURE CHARACTERIZATION OF LAYERED SEMICONDUCTORS

FIELD OF THE INVENTION

This invention relates generally to a method and apparatus for the structure characterization of semiconductors. More specifically, this invention relates to a new mehtod which characterizes the layered structure of semiconductors on a microscopic basis by exploiting laser signals in the presence of a direct current (DC) magnetic bias field. Laser signals are applied to the semiconductor sample through the use of optical fibers and, therefore, local characterization of the sample structure can be realized. The applicants' invention can provide data on the carrier concentration and mobility for each of the semiconductor layers, since depth profiling has been explicitly incorporated in the disclosed method.

BACKGROUND OF THE INVENTION

The combination of ternary and quaternary compounds (for example, $GaAs_xP_{1-x}$, $Al_xGa_{1-x}As$, $Ga_xIn_{1-x}As_yP_{1-y}$) has led to the fabrication of high performance devices. One of these is the heterostructure bipolar transistor where the emitter is formed in a wide band gap semiconductor and this structure promises maximum frequencies of oscillation of 100 GHz and switching times of 10 ps. The first so-called modulation doped superlattice in which alternate layers of GaAs and $Al_xGa_{1-x}As$ were realized in 1978 (R. Dingle, H. L. Stormer, A. C. Gossard, and W. Wiegmann, "Electron Mobilities in Modulation-Doped Semiconductor Heterojunction Superlattices, Appl. Phys. Lett., vol. 33, 665, 1978.). Because electrons have higher affinity for GaAs, free electrons in the $Al_xGa_{1-x}As$ layers are transferred to the undoped GaAs layer where they form a quasi two dimensional Fermi (electron) gas. The quasi two dimensional electron gas 2-DEG) accumulating at the heterojunction interface shows extremely high mobility especially at low temperatures. The mobility enhancement behavior is interpreted as being due to the separation of electrons from their parent donor impurities. The growth of an undoped AlGaAs "spacer layer" between the undoped GaAs and the n-doped AlGaAs enhances the electron mobility.

Therefore, materials for present-day high speed devices, such as high electron mobility transistors (HEMT), often have many conducting layers and the straightforward DC Hall-effect techniques can be of only very limited use to analyze the materials. The problem with the application of straightforward DC Hall-effect techniques is that the standard DC Hall effect method measures only two parameters, resistivity, $\rho$, and the Hall coefficient, $R_H$. Thus, this method is only capable of determining two unknowns, the carrier concentration, n, and mobility, $\mu$, in a single layer. Extra information might be obtainable by measuring the magnetic field dependencies of $\rho$ and $R_H$ upon which n and $\mu$ can be indirectly determined for a two-layered structure (D. C. Look, C. E. Stutz, and C. A. Bozada, "Analytical Two-Layer Hall Analysis: Application to Modulation Doped Field-Effect Transistors," J. Appl. Phys., vol. 74, 311, 1993.). Shortcomings for the current DC Hall-effect measurements are that they are not able to profile a semiconductor sample either horizontally or vertically. Under DC measurements the sample is subject to a uniform magnetic/Lorentz force upon which the overall response of the sample is measured as an average. It is very unlikely to detect spatial inhomogeneities of the sample microscopically when employing a traditional DC Hall-effect technique. Also, it is difficult to analyze the data performing depth profiling. For example, the present theory in DC Hall-effect always assume the limiting cases adopting either the so-called two-band or the two-layer model D. A. Syphers, K. P. Martin, and R. J. Higgins, "Determination of Transport Coefficients in High Mobility Heterostructure Systems in the Presence of Parallel Conduction," Appl. Phys. Lett., vol. 49, 534, 1986.). In reality, space charges can accumulate/deplete across the sample layer boundaries depending on the relative strength of their respective electrochemical potentials. A new analytic model accommodating explicit depth profiling in a layered semiconductor structure is therefore in need.

OBJECTS OF THE INVENTION

It is therefore an object of the present invention to provide a new method for local characterization of semiconductors, which overcomes the aforementioned difficulties encountered in the prior art.

Another object of the invention is to provide a semiconductor characterization method, which employs the AC Hall effect so that the measurements of parameters are functional dependent on frequency.

Yet another object of the present invention is to provide a semiconductor measuring technique by employing the AC Hall effect, wherein the measurements can incorporate depth profiling to reveal the internal structure of a layered semiconductor heterojunction.

Still another object of the present invention is to provide a semiconductor measuring mentod by employing the AC Hall effect wherein the measurements can accommodate a two dimensional structure condensated with Fermi electron gases.

These and still other objects of the present invention will become apparent to those skilled in the art from the following description.

SUMMARY OF THE INVENTION

A new method is disclosed and apparatus, which is able to provide local characterization of a layered semiconductor sample. The disclosed method exploits AC Hall effect which is applied to the sample through the use of laser signals. In the presence of a DC bias magnetic field, the AC currents induced by the laser signal will experience a Lorentz force which deflect the electron/hole motion in the semiconductor, resulting in polarization rotation of the incident radiation. Therefore, by measuring the cross-polarized signals in the reflected and/or the transmitted beams, AC Hall effect can be suitably characterized. Since no DC Hall voltage is measured, the method can be applied in microscopic scale limited only by the size of the incident laser beam. Optical fibers can be therefore employed as the signal probes which allow for scanning of the sample over a two dimensional surface. Most importantly, depth profiling of the semiconductor sample can be incorporated in this new technique. Since electromagnetic wave propagates sequentially across the layers, the overall radiation from the sample can be thus accurately estimated provided that the respective parameters associated with each of the layers are known a priori. This requires the electrochemical potential within the sample to be known as a function of depth.

BRIEF DESCRIPTION OF THE DRAWINGS

FIG. 4 is a schematic illustration of an embodiment of the present invention showing the measuring apparatus, the sample, the sample holder, and the means for providing a direct current magnetic field to the sample, and the laser signal.

DETAILED DESCRIPTION OF THE INVENTION

Figure 1:
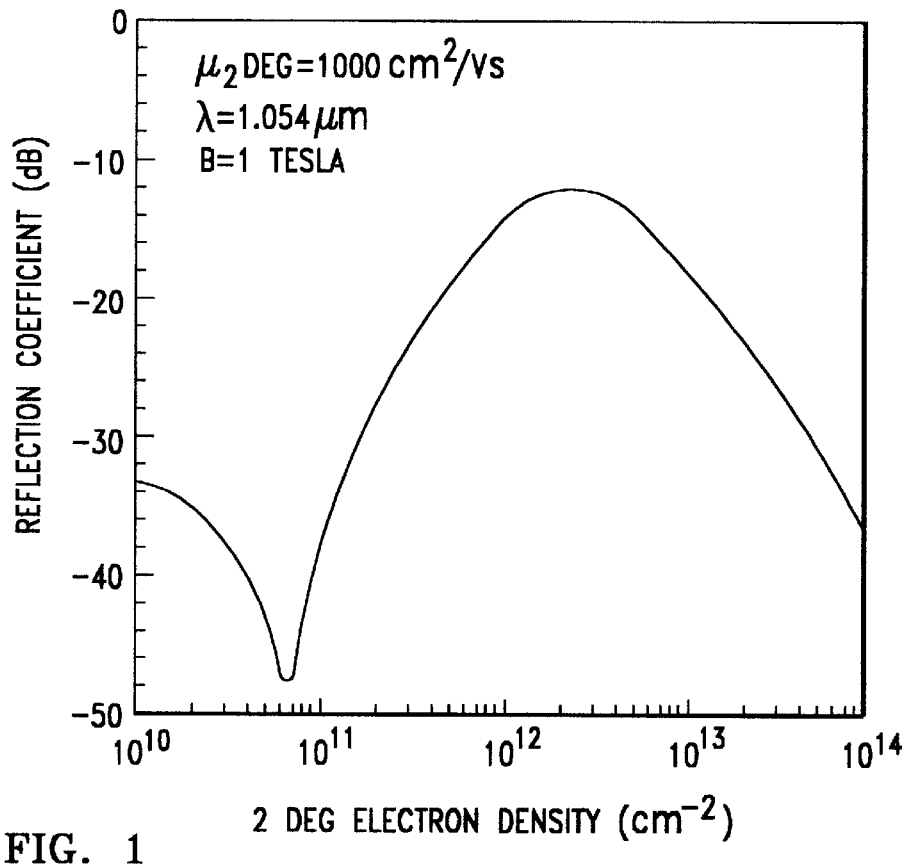
FIG. 1 shows the calculated AC Hall reflection coefficient as a function of the surface charge density occurring in a 2-DEG sheet in a semiconductor heterostructure junction.

The disclosed method and apparatus is capable of providing local characterization of a layered semiconductor sample. The disclosed invention exploits the AC Hall effect, which is applied to the sample through the use of laser signals. In the presence of a DC bias magnetic field, the AC currents induced by the laser signal will experience a Lorentz force which deflect the electron/hole motion in the semiconductor, resulting in polarization rotation of the incident radiation. Therefore, by measuring the cross-polarized signals in the reflected and/or the transmitted beams, AC Hall effect can be suitably characterized. Since no DC Hall voltage is measured, the method can be applied in microscopic scale limited only by the size of the incident laser beam. Optical fibers can be therefore employed as the signal probes which allow for scanning of the sample over a two dimensional surface. Also of significant importance is the ability of the disclosed invention to provide a depth profile of the semiconductor sample. Since electromagnetic wave propagates sequentially across the layers, the overall radiation from the sample can be thus accurately estimated provided that the respective parameters associated with each of the layers are known a priori. This requires the electrochemical potential within the sample to be known as a function of depth.

In reality, many times, the electrochemical potential in a layered sample is unknown. However, the disclosed method is still capable of obtaining values for the desired chareacteristics of the sample. In this case, the electrochemical potential, or equivalently, the carrier concentrations in the layered structure, is calculated using a trial and error method until a best fit between theory and measurement is obtained. This analytical procedure can be significantly accelerated when it is performed using powerful numerical searching routines. For example, the "steepest descent" method is generally applied for the matched filter theory, as taught by J. A. Hudson, in "Adaptave Array Priciples" (The Insitution of Electrical Engineers, London and New York, 1981).

The proposed analytical method can be carried out in a manner similar to that utilized for DC magneto-Hall measurements; that is AC-Hall reflection/transmission coefficients are measured as a function of DC bias magnetic field. Additional dependence on frequency is possible if measurements are carried out over a wide frequency spectrum, or, if a pulsed laser of short duration is used as signal probe. The functional dependence of the measured coefficients are then used for curve fitting to determine the unknown parameters.

AC Hall measurements can be combined with other local characterization, for example four probe resistivity measurements, to yield full advantage of the disclosed method.

We first consider a semiconductor bulk consisting of only one kind of charge carriers, say, electrons of concentration n. The general case for two band carriers in multilayers will be considered later.

Turning now to the figures, in the presence of an electric field, $\underline{E}$, and a magnetic field, $\underline{B}$, the Lorentz force exerting on an electron takes the following form $$f = q(E + v \times B), \quad (1)$$

where $\underline{v}$ denotes the velocity and q the charge of the electron. The classical Drude model assumes $$\frac{d\underline{p}}{dt} = \underline{f} - \frac{\underline{p}}{\tau}, \quad (2)$$

where $\underline{p}$ is the momentum of the electron and $\tau$ is the delay time associated with the relaxation processes. Combining Eqs.(1) and (2), one obtains $$\underline{E} = \rho(1 - i\omega\tau)\underline{j} + \frac{1}{nq}\underline{B} \times \underline{j}. \quad (3)$$

Eq.(3) the current density, $\underline{j}$, and resistivity, $\rho$, are given as $$\underline{J} = nq\underline{v}, \quad (4)$$

$$\rho = \frac{m}{nq^2\tau}, \quad (5)$$

and $\underline{p}$ is related to the electron mass, m, and velocity, $\underline{v}$, as follows $$p = mv.$$

In deriving Eq.(3) the time dependence has been assumed to be $e^{-i\omega t}$.

Let the z-axis be parallel to the direction of the applied DC magnetic field, $\underline{B}$. From Eq. (3) one may define the following resistivity tensor $$\underline{\rho} = \begin{pmatrix} \rho(1 - i\omega\tau) & -R_H B & 0 \\ R_H B & \rho(1 - i\omega\tau) & 0 \\ 0 & 0 & (1 - i\omega\tau) \end{pmatrix} \quad (6)$$

In terms of Eq.(6) the permittivity tensor of the medium can be then written as $$\underline{\epsilon} = \epsilon_\infty \underline{1} + \frac{i}{\omega} \underline{\rho}^{-1}, \quad (7)$$

where $\epsilon_\infty$, after dividing by $\epsilon_0$, the permittivity of vacuum, denotes the (optical) dielectric constant of the medium. In Eq.(6) $R_H$ is defined as the Hall coefficient given by $$R_H = \frac{1}{nq}. \quad (8)$$

Eqs.(6) and (7) can be generalized to include two-band carriers subject to Boltzmann statistics, say electrons and holes. As analogous to the DC case, Eqs.(5) and (8) are then replaced by the following equations;

$$\rho = \frac{-1}{q(\mu_n n + \mu_p p)}, \quad (9)$$

$$R_H = -rq\rho^2(\mu_p^2 p - \mu_n^2 n), \quad (10)$$

where $\mu_p$ and $\mu_n$ are the mobility and p and n the concentration of holes and electrons, respectively. The thermal statistic factor is absorbed in a parameter r in Eq.(10) which is defined as $$r = \frac{\langle \tau^2 \rangle}{\langle \tau \rangle^2}. \quad (11)$$

Here <A> denotes the statistic average of quantity A over all the possible electronic states. If the relaxation processes are dominated by phonon scattering, then r=1.18, and r=1.93 for ionized impurity scattering. For degenerated bands, where $\tau$ becomes independent of the energy of the states, r=1. In Eq.(9) $\mu_p$ and $\mu_n$ may contain contributions from both processes arising from phonon and ionized impurity scattering whose explicit forms can be found elsewhere (R. A. Smith, "Semiconductors," 2nd Edition, Cambridge University Press, London, 1979.).

For the purposes of expanation of the disclosed invention, we will consider the propagation of electromagnetic waves in a layered semiconductor structure in which the wave propagation direction is parallel to the applied DC magnetic field, denoted as the z-axis. As such, the permittivity tensor of Eq.(7) can be diagonalized with respect to the two circularly polarized electromagnetic waves whose polarization directions are given as $$\hat{e}_\pm = \hat{e}_x \pm i\hat{e}_y,$$

where +(-) denotes for the right (left)-hand polarization. In terms of the circularly polarized waves the permittivity becomes $$\epsilon^\pm = \epsilon_\infty + \frac{i}{\omega} \frac{1}{\rho(1 - i\omega\tau)} \left(1 \mp \frac{iR_H B}{\rho(1 - i\omega\tau)}\right)^{-1}. \quad (12)$$

Again, $\epsilon^{+(-)}$ is associated with the right (left)-hand polarization.

Let the semiconductor structure consist of n layers. The zero-th and the (n+1)-th layers are both semi-infinite located above and below the semiconductor structure which can be either the air or the substrate. The DC magnetic field is applied normal to the layered structure and the optical signal is considered to propagate along the magnetic field direction (normal incidence). Denote the permittivities of the i-th layer as $\epsilon_{\pm,i}$, $1 \leq i \leq n$, which can be evaluated from Eq.(12) by using the respective parameters of the layer, including resistivity, carrier concentration, and mobility, etc. The permittivities of the zero-th (air) and the (n+1)-th (substrate) layers are denoted as, $\epsilon_O$ and $E^*_S$, respectively. The thickness of the i-th layer is $d_i$, $1 \leq i \leq n$. The propagation of electromagnetic waves in each layer can be conveniently described by the so-called ABCD law in optics or the transfer matrix theory adopted by microwave transmission-line engineers. The transfer matrix $\underline{\underline{T}}(d)$ translates a transverse electromagnetic field at location z over a distance d as the following:

$$\begin{pmatrix} e(z+d) \\ h(z+d) \end{pmatrix} = \underline{\underline{T}}(d) \cdot \begin{pmatrix} e(z) \\ h(z) \end{pmatrix}, \quad (13)$$

and $\underline{\underline{T}}(d)$ is given by $$\underline{\underline{T}}(d) = \begin{pmatrix} \cos kd & iZ \sin kd \\ \frac{i}{Z} \sin kd & \cos kd \end{pmatrix}. \quad (14)$$

Here k and Z denote the wave propagation constant and the characteristic impedance of the medium, respectively. They are given as $$k = \sqrt{\mu\epsilon}\omega, \text{ and } Z = \sqrt{\frac{\mu}{\epsilon}},$$

where $\mu$ and $\epsilon$ are permeability and permittivity of the medium. For the i-th semiconductor layer, $1 \leq i \leq n$, the corresponding transfer matrices, denoted as $\underline{\underline{T}}^{\pm,i}(d_i)$, can be then derived from Eq.(14) using the respective permittivity values of Eq.(12). The overall transfer matrices of the layered structure are therefore $$\underline{\underline{T}}^{\pm,tot} = \prod_{i=1}^{n} \underline{\underline{T}}^{\pm,tot} \cdot \begin{pmatrix} e^\pm_0 \\ h^\pm_0 \end{pmatrix}. \quad (15)$$

which translates the electromagnetic fields at the air side of the structure to the substrate side by the following equation $$\begin{pmatrix} e^\pm_s \\ h^\pm_s \end{pmatrix} = \underline{\underline{T}}^{\pm,tot} \cdot \begin{pmatrix} e^\pm_0 \\ h^\pm_0 \end{pmatrix}. \quad (16)$$

In Eq.(16) subscript o(s) denotes the air (substrate) side of the layered structure and +(-) is for right (left)-hand polarization. Let the overall transfer matrices be written in the following normalized form $$\underline{\underline{T}}^{\pm,tot} = \begin{pmatrix} a^\pm & b^\pm Z_0 \\ \frac{c^\pm}{Z_0} & d^\pm \end{pmatrix}, \quad (17)$$

where $Z_O$ denotes the wave characteristic impedance of air (377 $\Omega$). Let $Z^\pm_S$ be the wave characteristic impedances of the substrate. One derives the following equations $$e^\pm_0 = (1 + r^\pm) e^\pm_{in}, \quad (18)$$

$$h^\pm_0 = (1 - r^\pm) \frac{e^\pm_{in}}{Z_0}, \quad (19)$$

$$\frac{e^\pm_s}{h^\pm_s} = Z^\pm_s, \quad (20)$$

$$\frac{e^\pm_s}{e^\pm_{in}} = t^\pm. \quad (21)$$

In the above equations $e^\pm_{in}$ denotes the incident electric field of the right/left-hand polarization at the air side of the layered structure, and $r^\pm$ and $t^\pm$ are the reflection and transmission coefficients, respectively. From Eqs.(16) to (21) $r^\pm$ and $t^\pm$ can be solved as $$r^\pm = \frac{-(a^\pm + b^\pm)Z_0 + (c^\pm + d^\pm)Z^\pm_s}{(a^\pm - b^\pm)Z_0 - (c^\pm - d^\pm)Z^\pm_s}. \quad (22)$$

$$t^\pm = \frac{2(a^\pm d^\pm - b^\pm c^\pm)Z^\pm_s}{(a^\pm - b^\pm)Z_0 - (c^\pm - d^\pm)Z^\pm_s}. \quad (23)$$

Let the incident beam be linearly polarized along the x-direction. The reflected beam will contain signals polarized in the y-direction due to AC Hall rotation. Therefore, by expressing the incident beam using circularly polarized waves, the AC Hall reflection and transmission coefficents can be calculated. That is, one uses the following relationships in composing and sing the incident and reflected beams:

$$\hat{e}_x = (\hat{e}_+ + \hat{e}_-)/2, \, \hat{e}_y = (\hat{e}_+ - \hat{e}_-)/2i,$$

and AC Hall reflection coefficient can be then derived as $$r_{AC\text{-}Hall}=(r^+-r^-)/2i. \quad (24)$$

The Hall transmission coefficient can be derived in an identical form replacing $r^\pm$ by $t^\pm$ in the equation.

EXAMPLE

Figure 3:
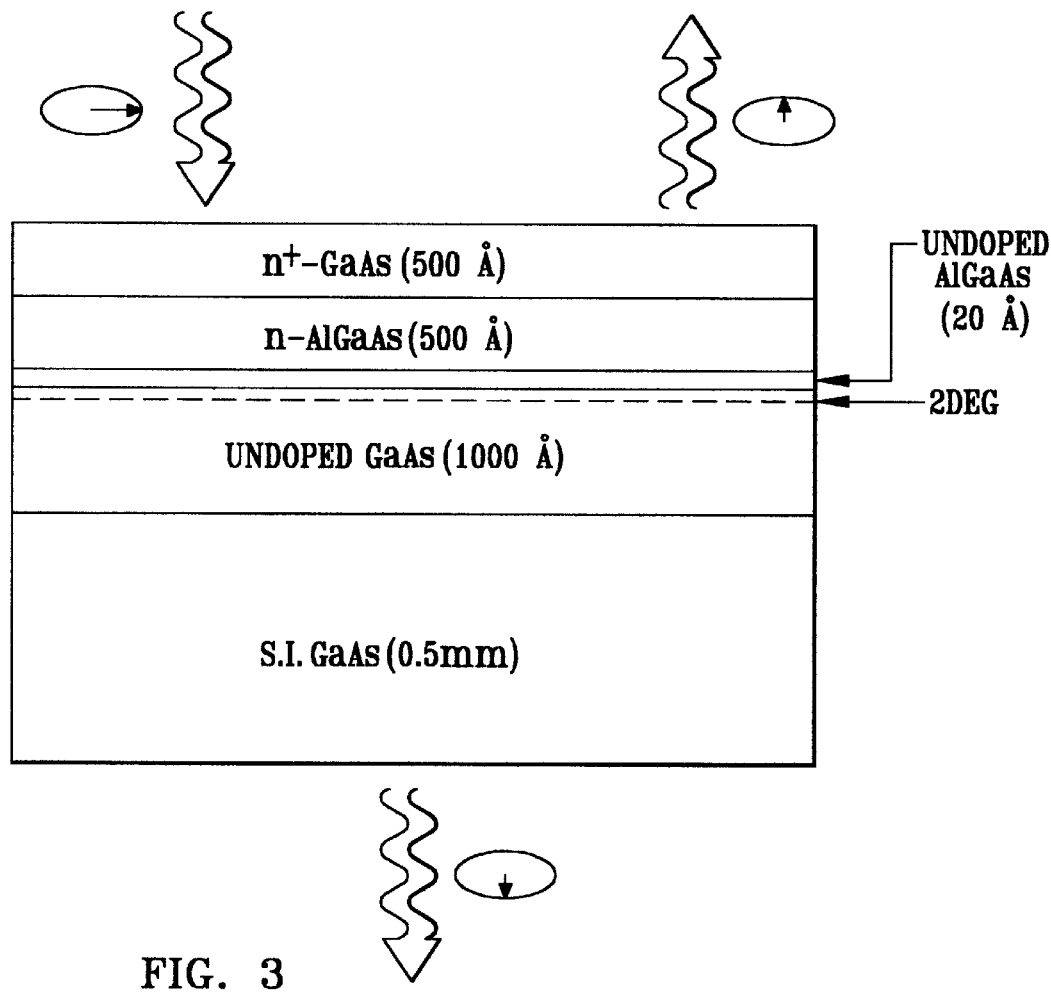
FIG. 3 shows a cross sectional representation of a semiconductor heterostructure comprising 5 layers.

As a sample calculation, AC Hall reflection on a semiconductor heterostructure comprising five layers (n=5) will be considered. FIG. 3 shows the layered structure and Table 1 summarizes the respective parameters of the various layers.

TABLE 1

| Layer | Type | d (Å) | n(cm$^{-3}$) or [n$_s$(cm$^{-2}$)] | ρ(Ω · cm) or [R$_s$(Ω)] | μ(cm$^2$/V · s) |
|---|---|---|---|---|---|
| 1 | n$^+$-GaAs | 500 | 10$^{18}$ | 1.56 × 10$^{-3}$ | 4000 |
| 2 | n-AlGaAs | 500 | 10$^{17}$ | 6.25 × 10$^{-2}$ | 1000 |
| 3 | undoped-AlGaAs | 20 | 10$^{14}$ | 62.5 | 1000 |
| 4 | 2-DEG | 0 | [10$^{12}$]* | [625] | 10000* |
| 5 | undoped-GaAs | 1000 | 10$^{14}$ | 15.6 | 4000 |
| Substrate | S.I. GaAs | ∞ | 10$^6$ | 6.25 × 10$^9$ | 1000 |

*Unless specified otherwise.

The first layer is the cap material made of n$^+$-GaAs with carrier concentration 10$^{18}$ cm$^{-3}$ for ohmic contact purposes. The second layer is n-AlGaAs, which provides electrons to form a quasi two-dimensional Fermi gas near the AlGaAs-GaAs interface (2-DEG). The dopant level here is 10$^{18}$ cm$^{-3}$. However, due to electron diffusion into the 2-DEG sheet, the electron concentration in the second layer is about an order smaller than the dopant level (10$^{17}$ cm$^{-3}$). The third layer is an undoped AlGaAs layer, which serves as a spacer to separate the accumulated electrons in the 2-DEG sheet from their parent donor impurities in the second layer to enhance electron mobility. The fourth layer is the 2-DEG sheet whose default values in carrier concentration and mobility are 10$^{12}$ cm$^{-2}$ and 10000 cm$^2$/V·s, respectively. The fifth layer is the undoped GaAs-material, which, due to its high electron affinity, attracts electrons from the n$^+$-AlGaAs layer to form the 2-DEG sheet.

We consider the electron mobility for the AlGaAs materials to be 1000 cm$^2$V·s and 4000 cm$^2$/V·s for the GaAs materials. The carrier concentration for the undoped materials (AlGaAs and GaAs) is 10$^{14}$ cm$^{-3}$. The thickness of these layers are, respectively, 500, 500, 20, 0, and 1000 Å. We assume semi-insulating GaAs is used as the substrate, whose carrier concentration is 10$^6$ cm$^{-3}$ and mobility is 1000 cm$^2$/V·s. Resistivity values for the above materials can be all calculated by using Eq.(9) and they are summarized in Table 1.

In the following calculations we consider the optical dielectric constant of GaAs and AlGaAs to be 10.9, which differs from their DC value of 12.79. The statistic factor r is taken to be 1, which corresponds to the degenerate case of the electronic states. To be explicit, let the AC excitation be furnished by a D laser source providing light signals of wavelength λ=1.054 μm (for example, Quantronix 416).

FIG. 1 shows the calculational results. The AC Hall reflection coefficient is calculated as a function of the surface electron density in the 2-DEG sheet, n$_s$, assuming $\mu_{2\text{-}DEG}$=20000 cm$^2$/V·s, B=1 T and λ=1.054 μm. It is seen in FIG. 1 that for n$_s$<7×10$^{10}$ cm$^{-2}$, AC Hall reflection is resulted from electron deflection (polarization rotation in the 2-DEG sheet, identified as the larger (primary) peak in the reflection curve of FIG. 1. For n$_s$ <7×10$^{10}$ cm$^{-2}$, reflection from the cap (first) layer dominates, appearing as the smaller (secondary) peak in FIG. 1. AC Hall reflection due to the other layers (layers 2,3,4 and substrate) are almost invisible in FIG. 1, indicating the fact that the considered semiconductor structure is essentially a two layered system producing Hall rotation and the consequent reflection. Most importantly, for n$_s$ in the order of 10$^{12}$ cm$^{-2}$, which corresponds to the true physical situation, the calculated reflection coefficient falls in the range between −10 and −20 dB. The calculated reflection hence warrants sufficient intensity to be measured experimentally.

Figure 2:
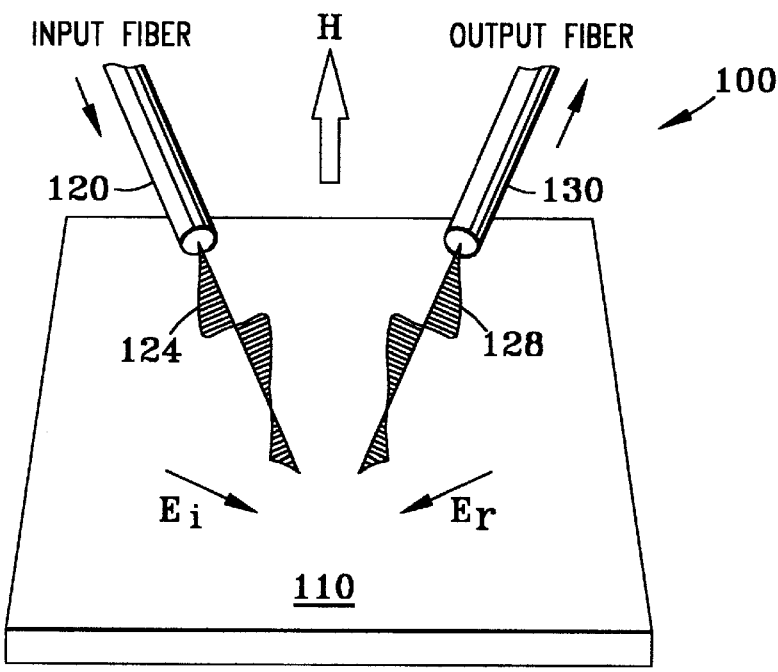
FIG. 2 shows an apparatus which measures the parameters in a layered semiconductor to perform the task of local characterization, which includes an input and an output fiber, which are used to convey reflected signals under oblique incidence.

FIG. 2 shows a schematic drawing of the apparatus of the present invenion which measures AC Hall-effect rotation in a semiconductor sample. A measuring apparatus 100 is applied to a sample 110, held in a sample holder 112, for measurements. A DC magnetic field, H, is applied normal to the sample surface. The linearly polarized laser signal 124 is applied to the sample through an optical fiber 120. As an alternative, the polarized laser signal may be applied to the sample through the use of lenses. This will induce an AC current in the sample parallel to the polarization direction of E. Due to Hall rotation, the currents will be deflected, resulting in the reflection of the laser signal with polarization parallel to E$_r$. Reflected signal 128 is then conveyed to a second optical fiber 130. The cross-polarized radiation sensed by optical fiber 130 can be thus measured, which is then compared to the calculations to reveal quantitatively the nature or the sample, Eq. (22). Since the optical fibers can be moved freely along the surface of the sample, two dimensional local characterization of the sample is possible. Local characterization in microscopic scale is limited only by the size of the fibers employed, which are usually in the order of 1 μm.

Figure 4:
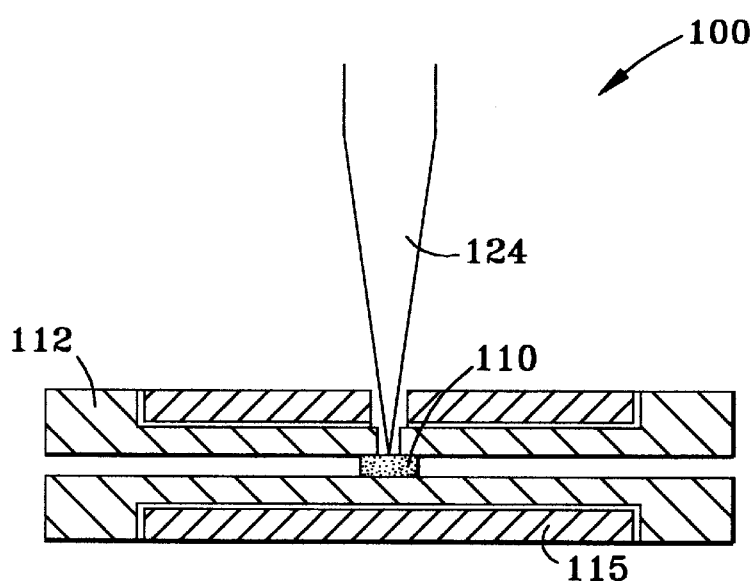
FIG. 4 shows a block diagram showing the major components of the apparatus shown in FIG. 2.

FIG. 4 shows a schematic drawing of a measuring apparatus 100 of the present invention, including a sample 110, sample holder 112, means 115 for providing a direct current (DC) magnetic field to the sample, and a laser signal 124 applied to the sample. The means for providing a direct current magnetic field 115 to the sample may be any means known to those of skill in the art, such as, for example, a neodymium magnet or any permanent magnet, as opposed to using an alternating current (AC) magnetic field induced by an electric current.

Figure 5:
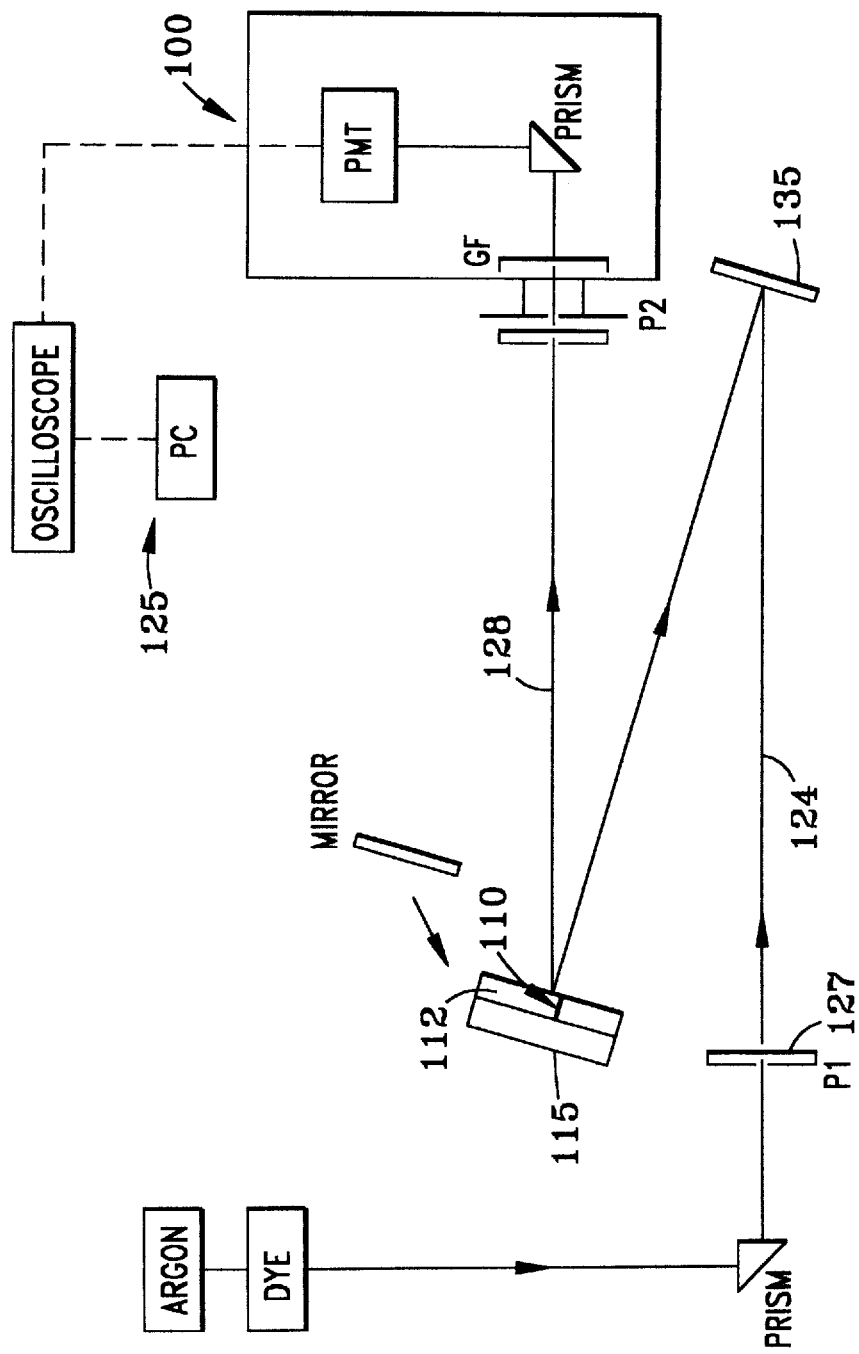
FIG. 5 is a schematic illustration of one embodiment of a complete set-up for taking measurements according to the present invention.

FIG. 5 shows schematically a complete set-up of an embodiment of the invention. An attenuated beam from a tunable, for example CW dye, laser pumped by UV lines from an argon ion laser is an optical signal which goes through a cross polarizer 127, preferably a Glan-Thompson cross polarizer, P1, to vertically polarize the laser beam. In this particular embodiment, the laser beam is transmitted by at least one lens or mirror 135, and then reaches the sample through the hole in the sample holder as shown in FIG. 2, the beam then reflecting back with its polarization rotated due to the optically induced oscillating Hall effect. The reflected signal is detected and measured by measuring apparatus 100 which comprises preferably a photomultiplier tube (PMT), preferably a high-linearity low-noise PMT type R955 in conjunction with an HC123-01 which is a high voltage supply and divider. Preferably in one embodiment, a 350 MHZ digital oscilloscope (preferably a LeCroy 9420 model) interfaced with and controlled by an IBM PC (or equivalent) via a GPIB-PCHA board 125 may be used to analyze and compare the detected, reflected signal 128. However, although specific examples are given, modifications of equipment and structure, such as the particular oscilloscope or means to measure and display signal, or the particular computer used to analyze and compare signals, would be known by those of ordinary skill and are possible without departing from the scope and intent of the present invention.

Variations of the present invention include the use of a single or multiple optical-fiber probes adapted in the relection and/or the transmission measurements in the configuration involving normal/oblique incidence. The disclosed method is not restricted to the use of merely optical signals. Other AC signals can be electromagnetic waves at lower frequencies, (microwaves, millimeter waves, etc.). AC Hall measurements can be applied to all kinds of semiconductor samples, including the semi-insulating materials used as the substrates of semiconductor devices.

Various additional changes coming within the spirit of the invention may suggest themselves to those skilled in the art; hence the invention is not limited to the specific embodiment shown or described, but the same is intended to be merely exemplary. It should be understood that numerous other modifications and embodiments can be devised by those skilled in the art that will fall within the spirit and scope of the principles of the invention.

What is claimed is:

1. A Hall effect method of characterizing a semiconductor sample to obtain data on carrier concentrations and mobilities comprising applying a direct current magnetic field normal to a sample, applying an optical signal to said sample, measuring variations in the optical signal as said signal is reflected by said sample and comparing said measured variations with analytical calculations.

2. The Hall effect method of characterizing a semiconductor sample to obtain data on carrier concentrations and mobilities as claimed in claim 1, wherein said optical signal is a polarized laser signal.

3. The Hall effect method of characterizing a semiconductor sample to obtain data on carrier concentratins and mobilities as claimed in claim 2, wherein said laser signal is applied to said sample, reflected by said sample and recoved through the use of an optical transmission means.

4. The Hall effect method of characterizing a semiconductor sample to obtain data on carrier concentrations and mobilities as claimed in claim 3, further comprising cross-polarizing at least one of said applied and recovered laser signal.

5. A Hall effect apparatus for characterizing a semiconductor sample to obtain data on carrier concentrations and mobilities comprising means for providing a direct current magnetic field normal to a sample, means for providing an optical signal to said sample, means for reading said optical signal as it is relected by said sample, means for measuring variations in said reflected optical signal and means for comparing said measured variations with analytical calculations.

6. The Hall effect apparatus as claimed in claim 5 wherein said means for providing said optical signal to said sample is a polarized laser.

7. The Hall effect apparatus as claimed in claim 5, wherein said means for providing said optical signal and means for reading said reflected signal is optical transmission means.

8. The Hall effect apparatus as claimed in claim 7 wherein said optical transmission means comprises means for cross-polarizing at least one of said applied and recovered laser beam.

9. The Hall effect apparatus as claimed in claim 8, wherein said optical transmission means further comprises a first, optical fiber to expose said laser beam to a portion of said sample and a second, optical fiber to recover said laser beam when it is reflected by said sample.

10. The Hall effect apparatus as claimed in claim 8, wherein said optical transmission means comprises a plurality of lenses.

* * * * *